US012635276B2

(12) United States Patent
Shim et al.

(10) Patent No.: US 12,635,276 B2
(45) Date of Patent: May 19, 2026

(54) SEMICONDUCTOR PACKAGES WITH RELIABLE COVERS

(71) Applicant: UTAC Headquarters Pte. Ltd., Singapore (SG)

(72) Inventors: Il Kwon Shim, Singapore (SG); Jeffrey Punzalan, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 776 days.

(21) Appl. No.: 17/936,859

(22) Filed: Sep. 30, 2022

(65) Prior Publication Data

US 2023/0098224 A1      Mar. 30, 2023

Related U.S. Application Data

(60) Provisional application No. 63/250,228, filed on Sep. 30, 2021.

(51) Int. Cl.
*H10F 39/00*          (2025.01)
*H01L 23/00*          (2006.01)
(52) U.S. Cl.
CPC ......... *H10F 39/804* (2025.01); *H10F 39/011* (2025.01); *H10F 39/811* (2025.01); *H01L 24/32* (2013.01); *H01L 24/48* (2013.01); *H01L 24/73* (2013.01); *H01L 2224/32225* (2013.01); *H01L 2224/48227* (2013.01); *H01L 2224/73265* (2013.01)
(58) Field of Classification Search
CPC .... H10F 39/804; H10F 39/011; H10F 39/811; H01L 24/32; H01L 24/48; H01L 24/73;

H01L 2224/32225; H01L 2224/48227; H01L 2224/73265; H01L 24/05; H01L 24/29; H01L 24/49; H01L 24/83; H01L 2224/48091; H01L 2224/48479; H01L 2224/49171; H01L 2924/00014; H01L 2924/15311; H01L 2924/16235; H01L 2924/181; H01L 2924/00012; H01L 2224/45099
See application file for complete search history.

(56) References Cited

U.S. PATENT DOCUMENTS

| | | | | |
|---|---|---|---|---|
| 2008/0252771 A1* | 10/2008 | Wu | ......................... | H04N 23/55 348/E5.025 |
| 2009/0045476 A1* | 2/2009 | Peng | ..................... | H10F 39/804 257/E31.127 |
| 2015/0011038 A1* | 1/2015 | Huang | .................... | H10F 77/50 438/66 |
| 2016/0260761 A1* | 9/2016 | Jun | ........................ | H10F 39/804 |

* cited by examiner

*Primary Examiner* — Teresa M. Arroyo
(74) *Attorney, Agent, or Firm* — HORIZON IP PTE LTD

(57) ABSTRACT

A semiconductor package is disclosed. The package includes a sensor die which is disposed on a package substrate. A cover structure is attached to a cover adhesive surrounding the sensor die, forming a cavity above the sensor die. The cover structure includes a primary cover structure and a secondary cover structure surrounding the primary cover structure. The secondary cover structure is configured to protect the primary cover structure from damage during packaging. The package also includes an encapsulant. The encapsulant covers side surfaces of the cover structure, sides of the cover adhesive, and exposed portions of the package substrate, leaving the first major cover surface exposed.

20 Claims, 17 Drawing Sheets

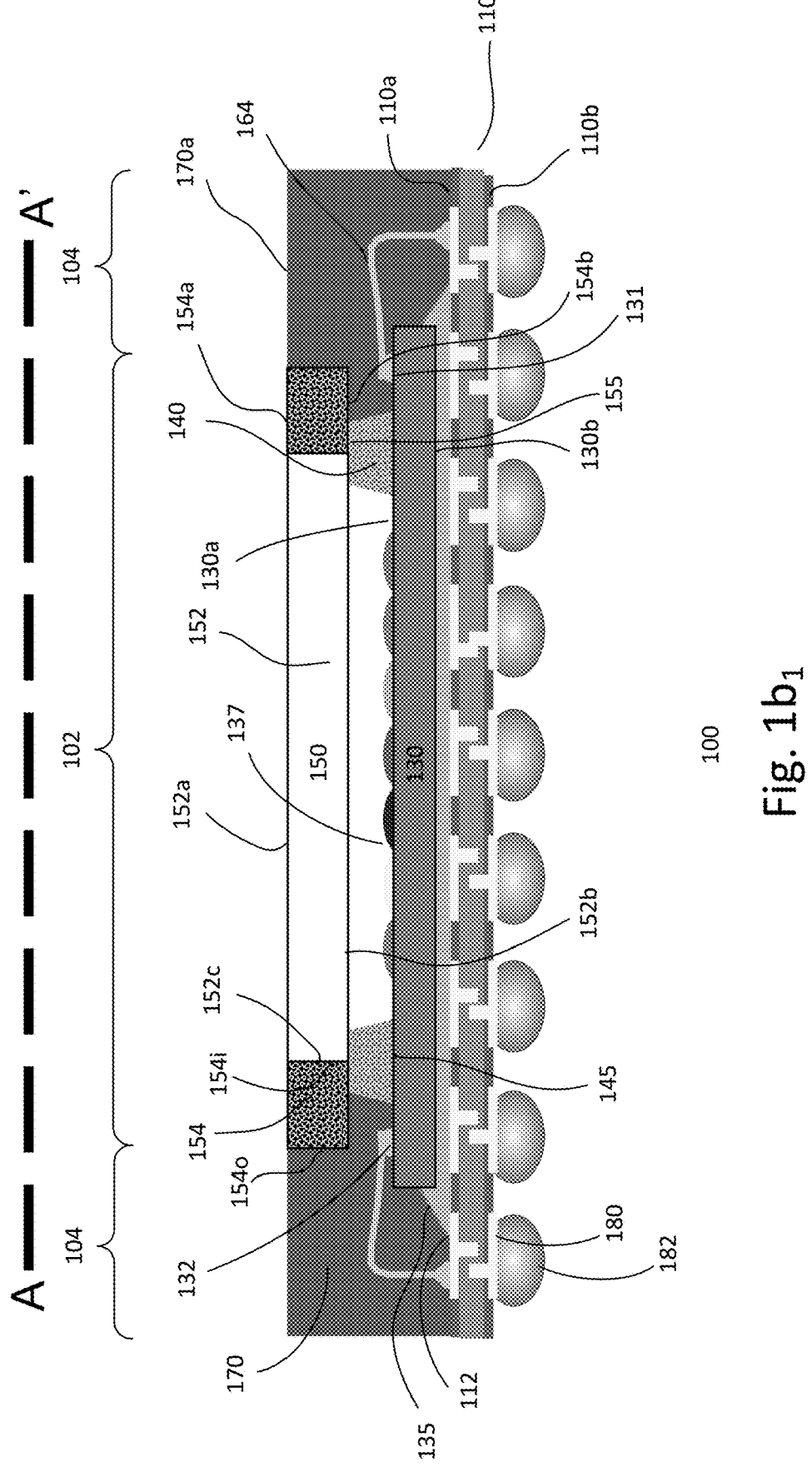
Fig. 1b₁

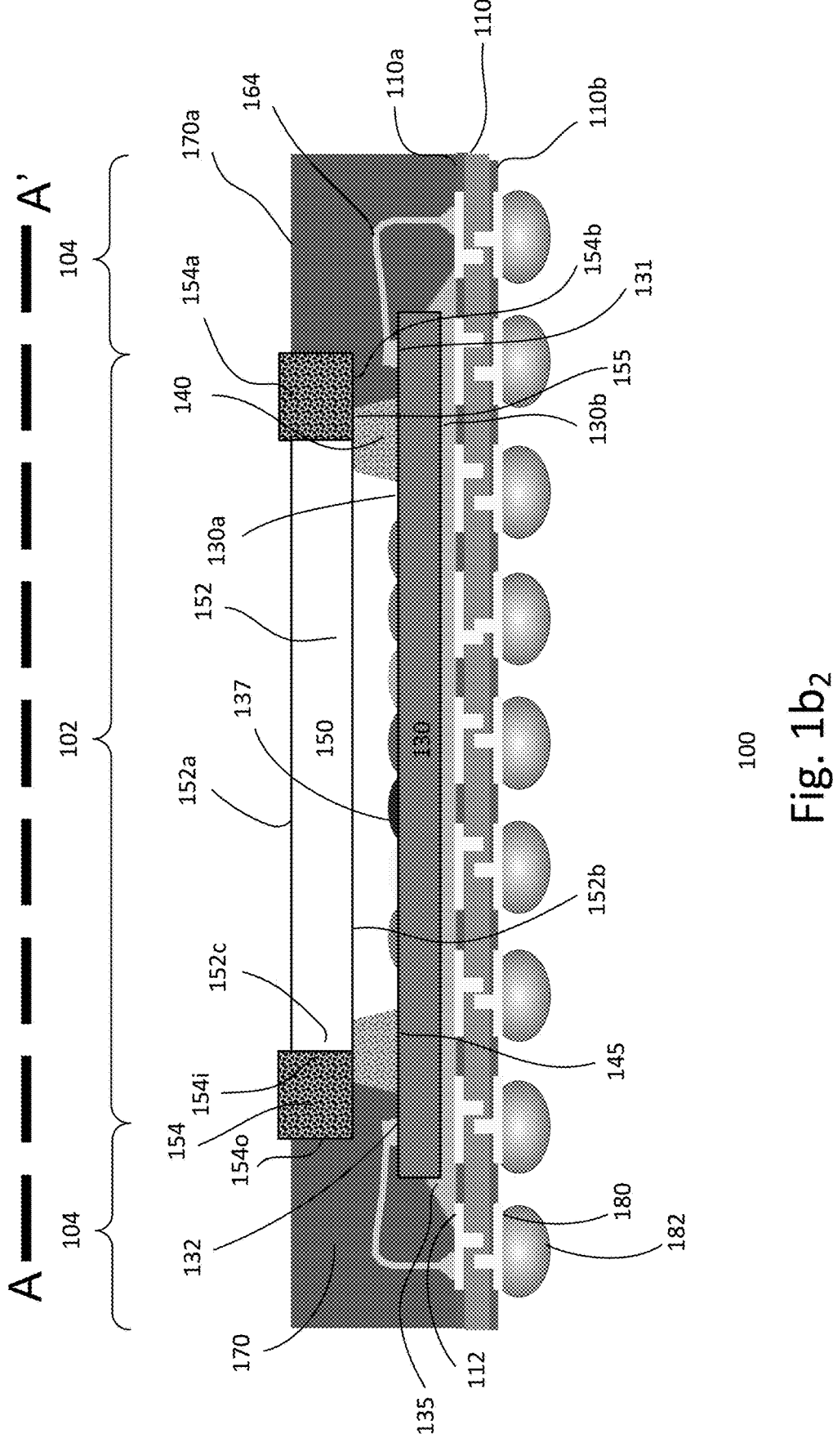
Fig. 1b₂

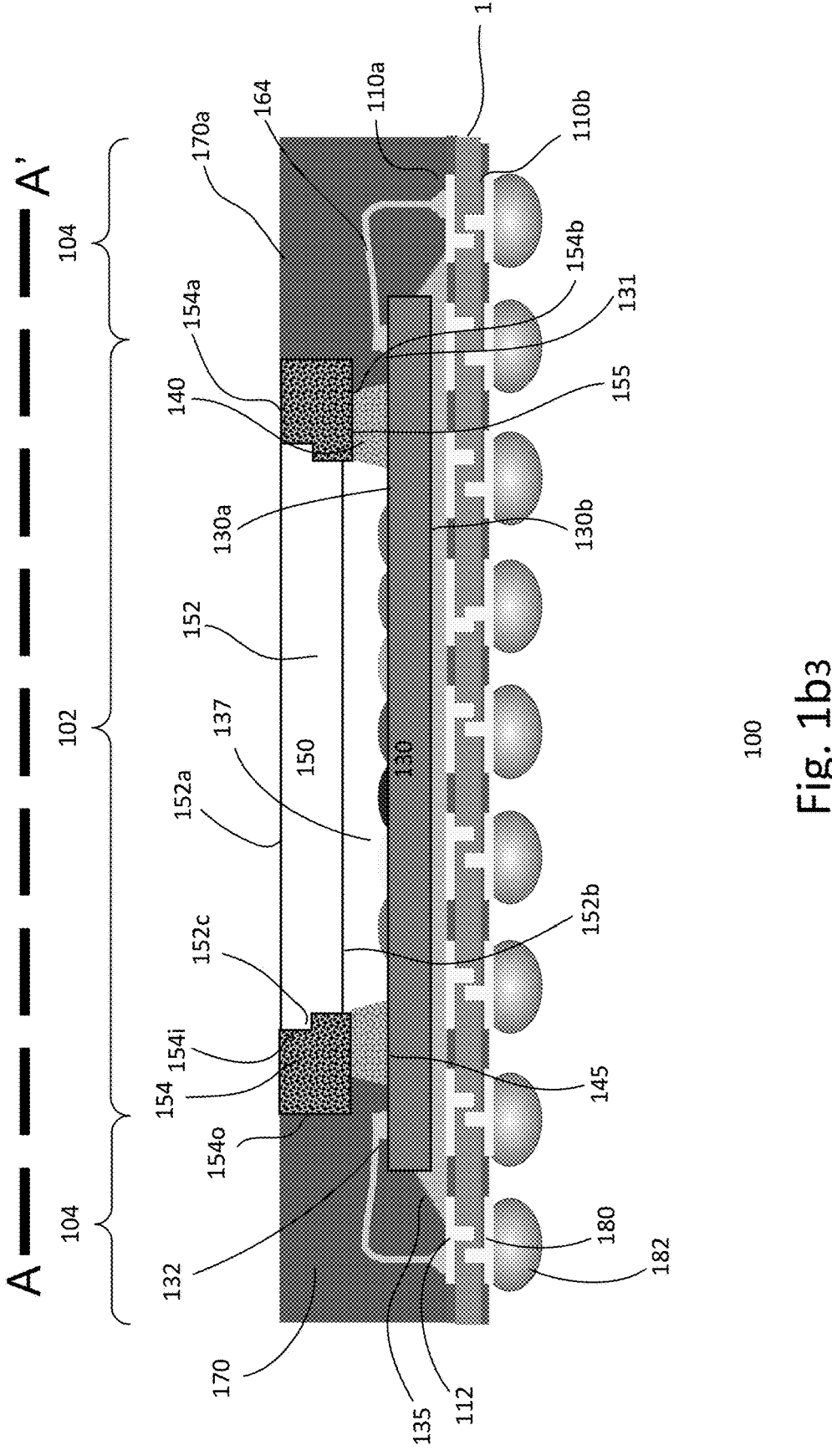
Fig. 1b3

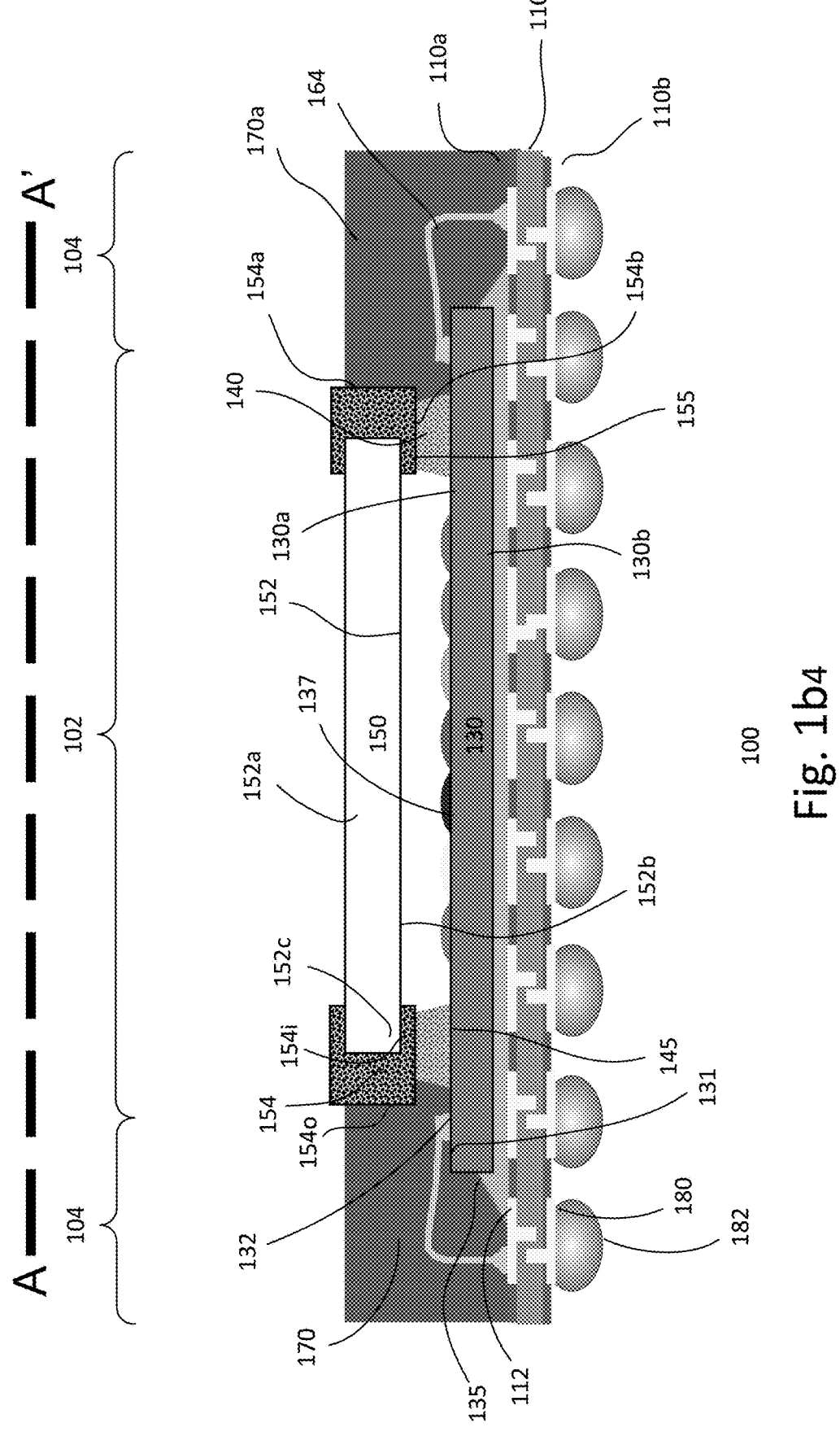
Fig. 1b4

154o

154a/154b

154

154i

152c

152

152a/152b

150

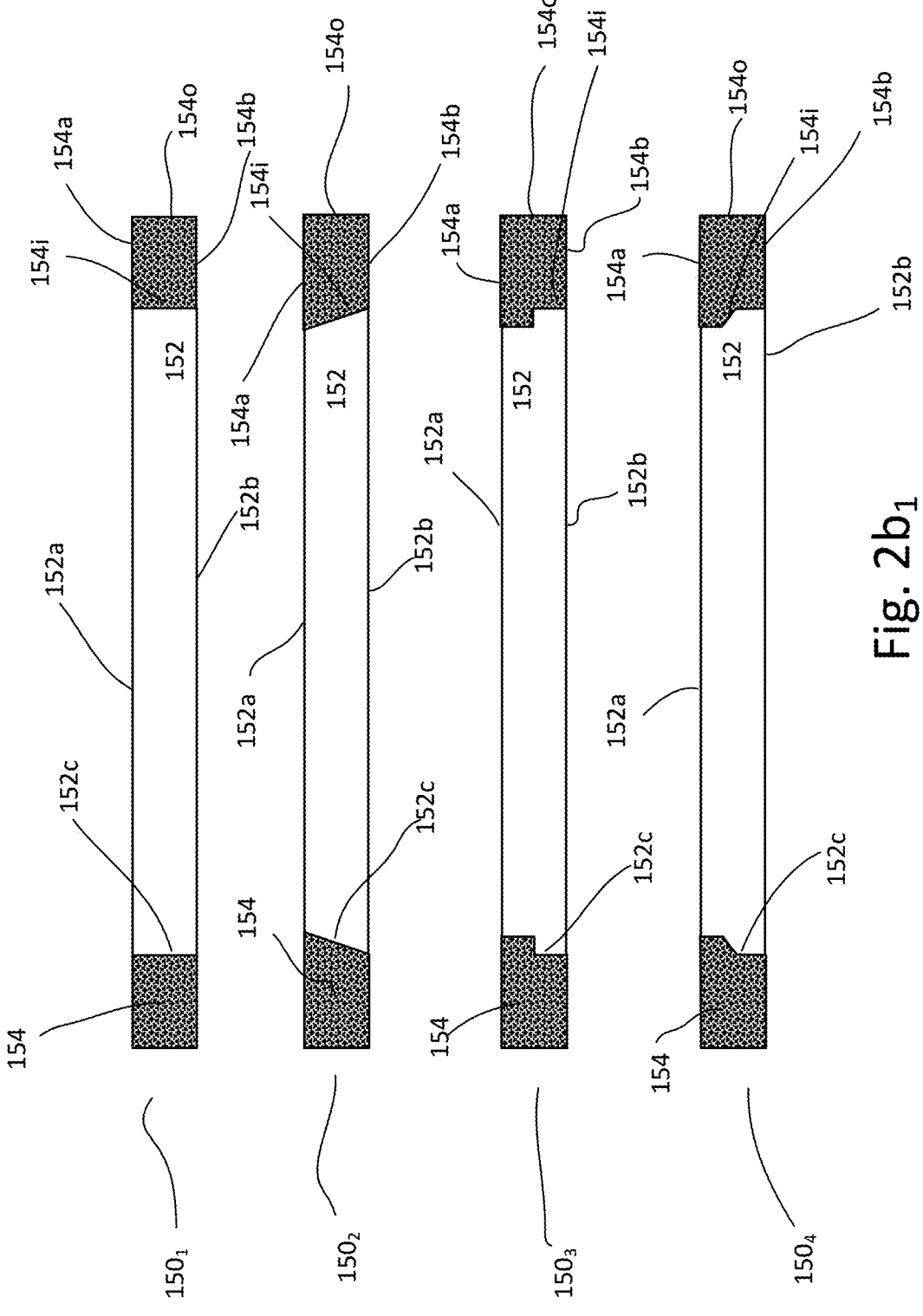
Fig. 2b₁

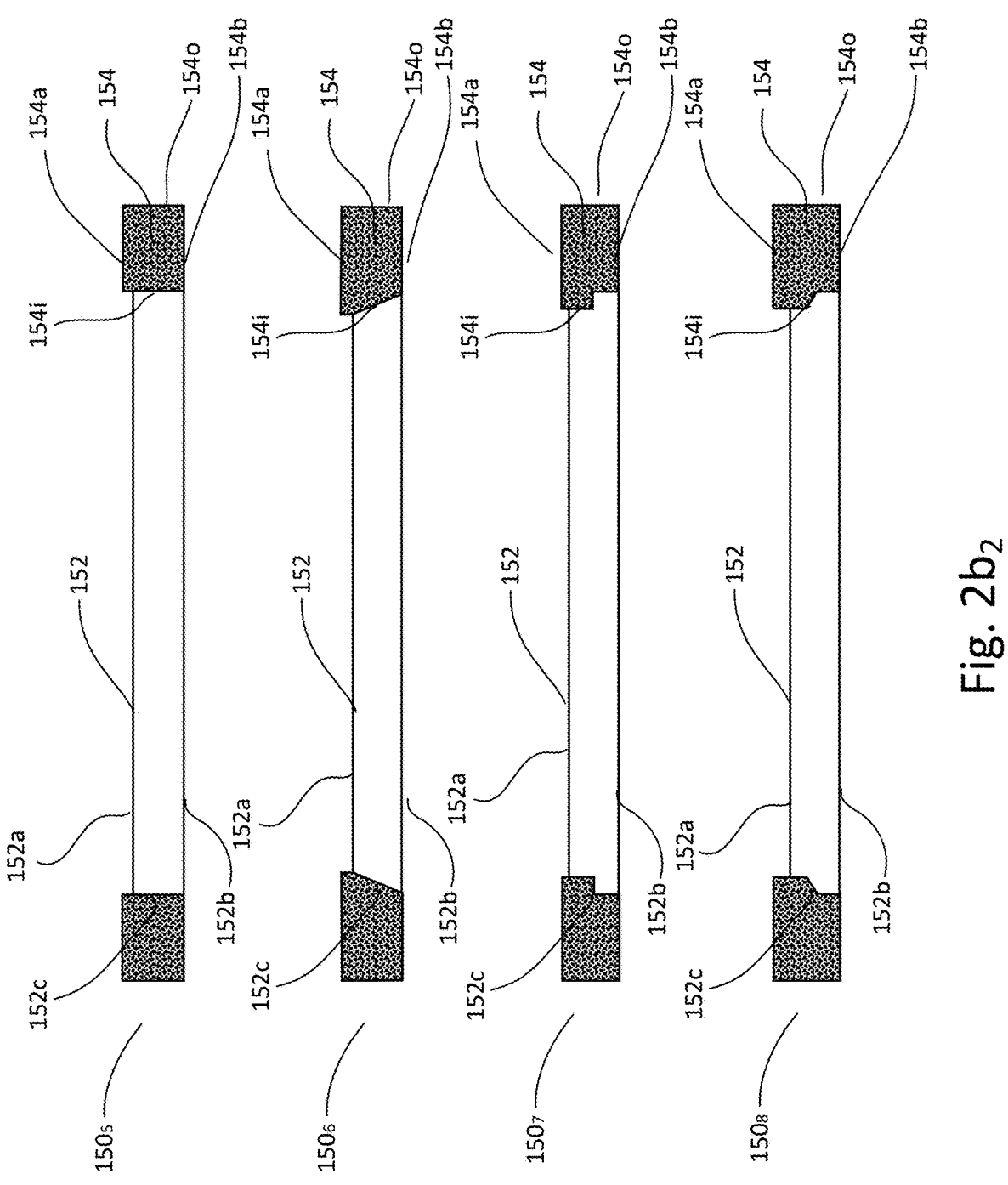
Fig. 2b$_2$

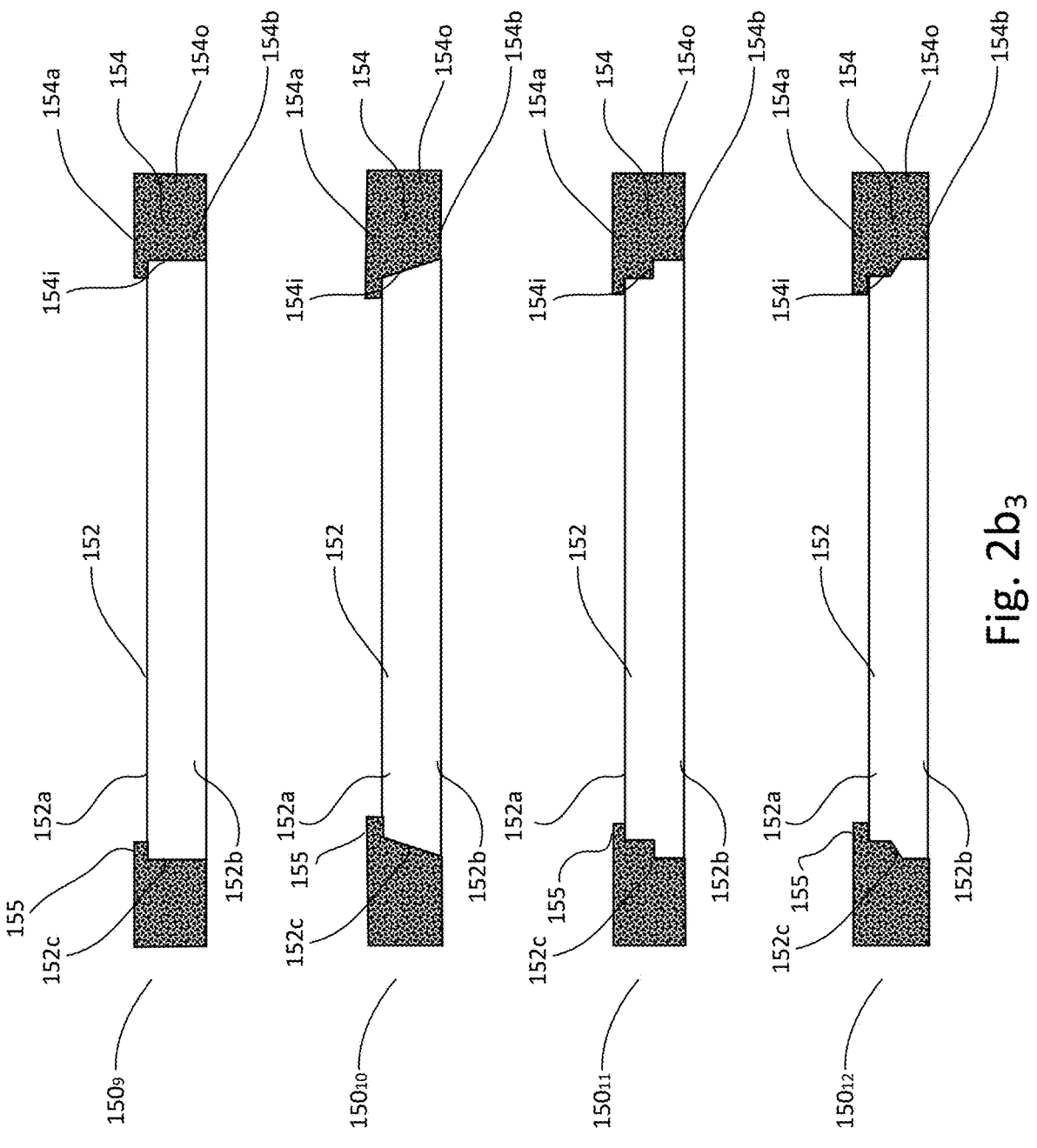
Fig. 2b₃

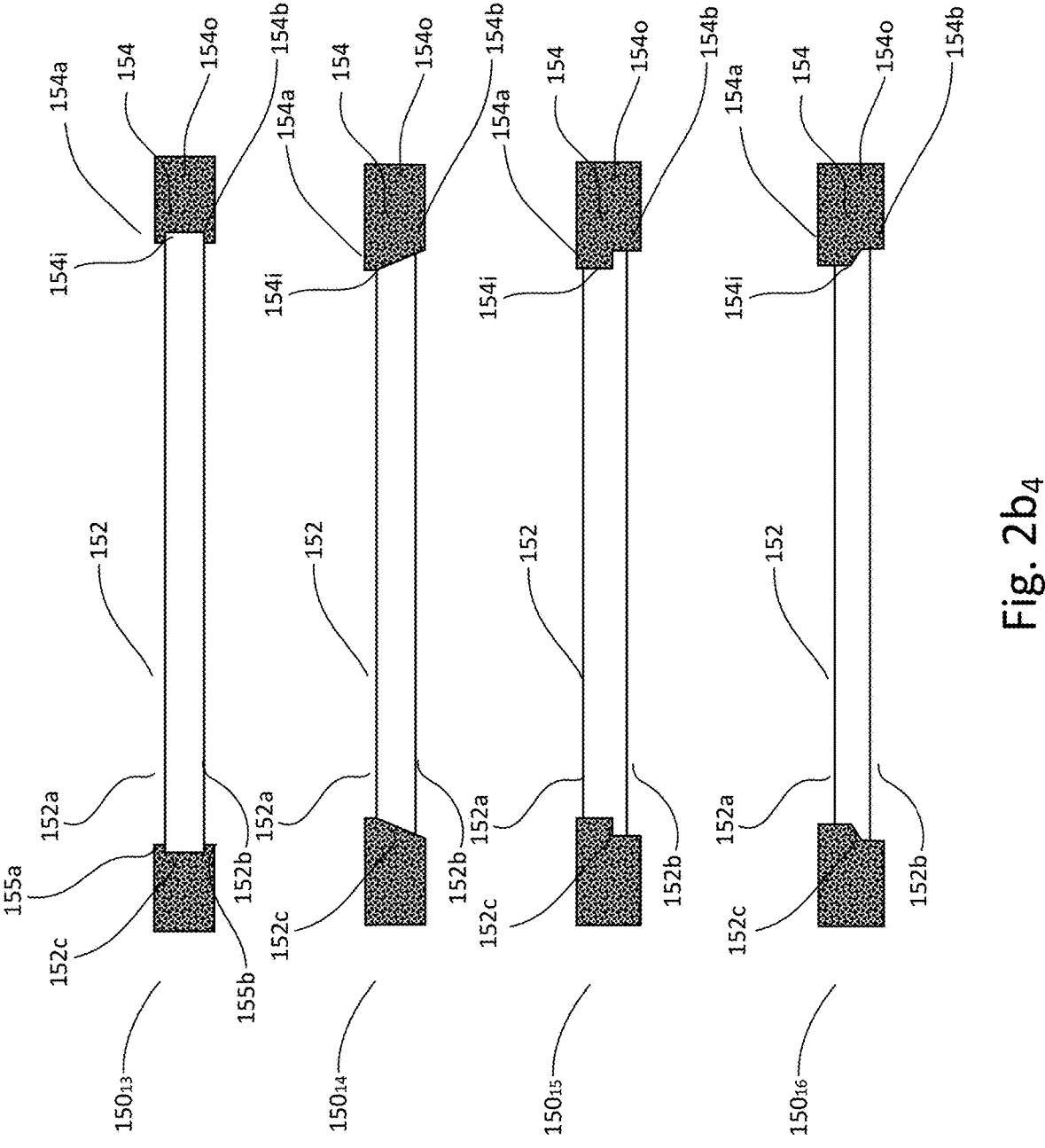
Fig. 2b$_4$

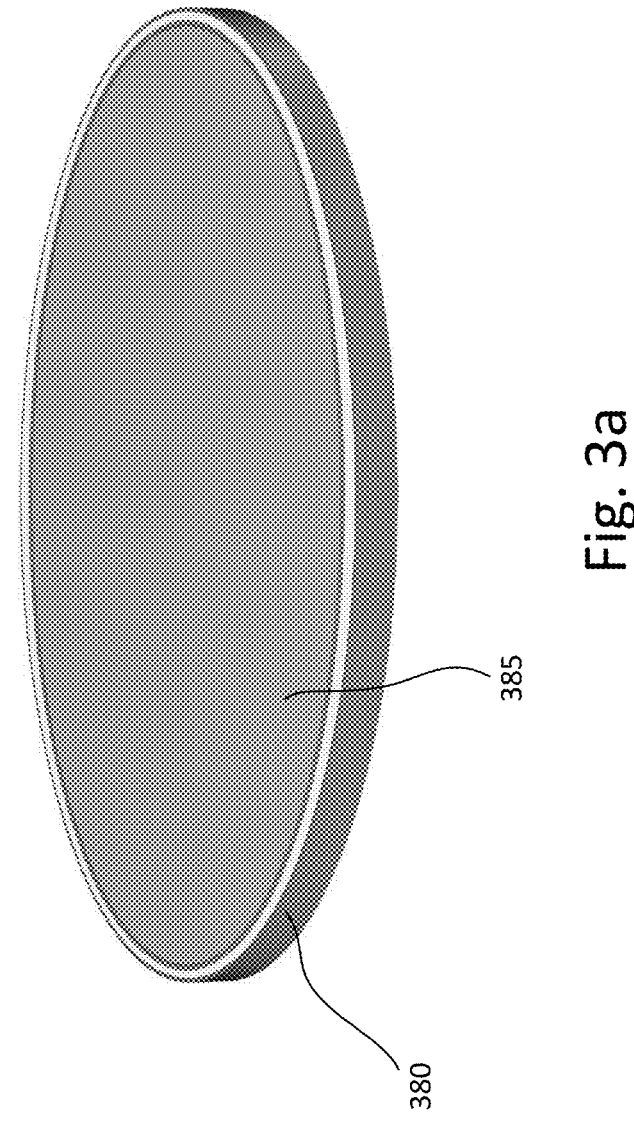
385
380
Fig. 3a

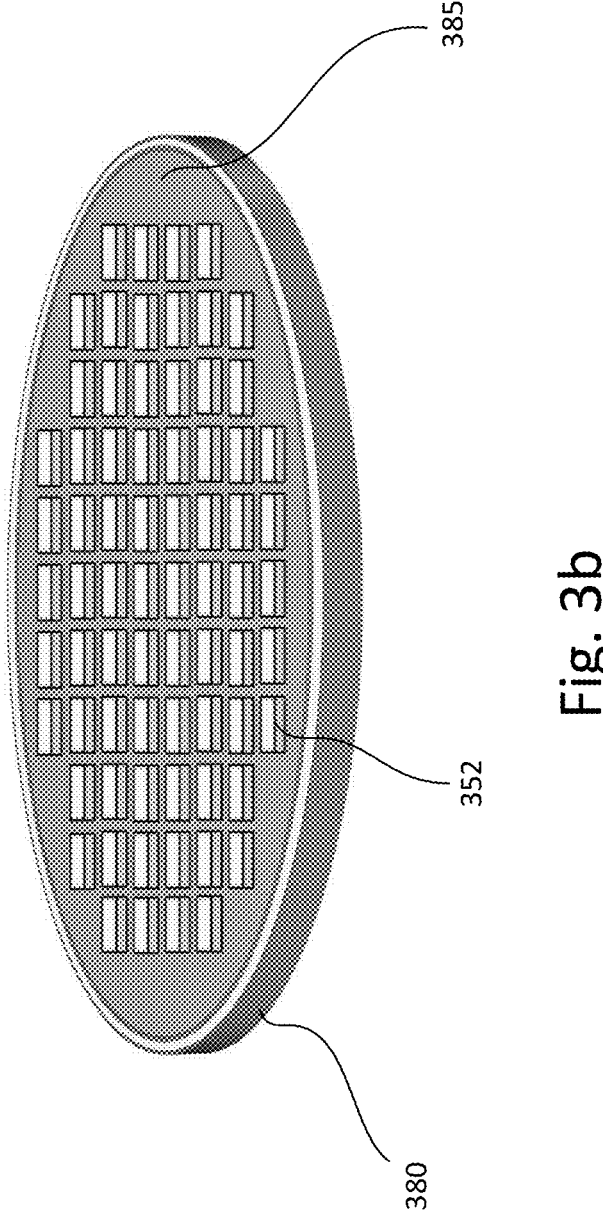
385
352
380
Fig. 3b
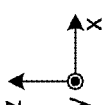

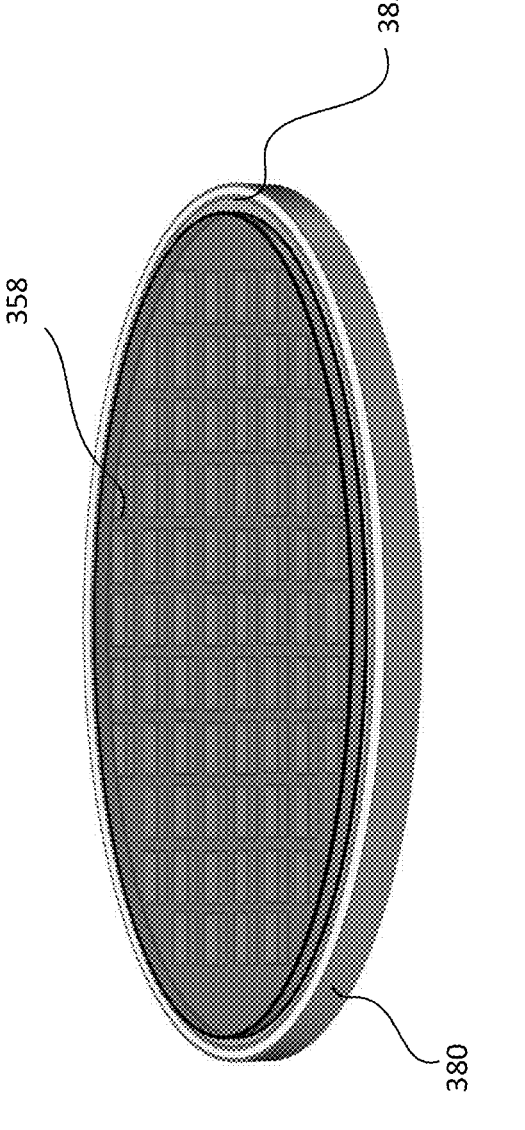
385
358
380
Fig. 3c

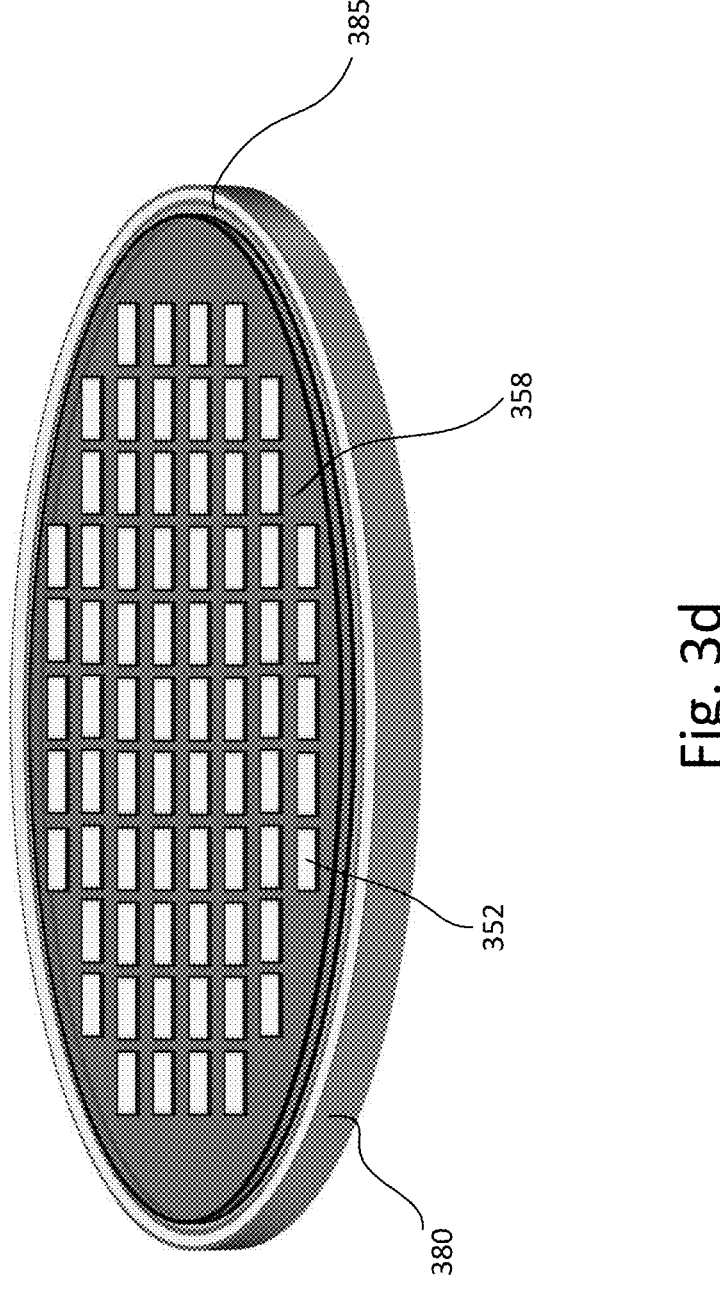
385
358
352
380
Fig. 3d

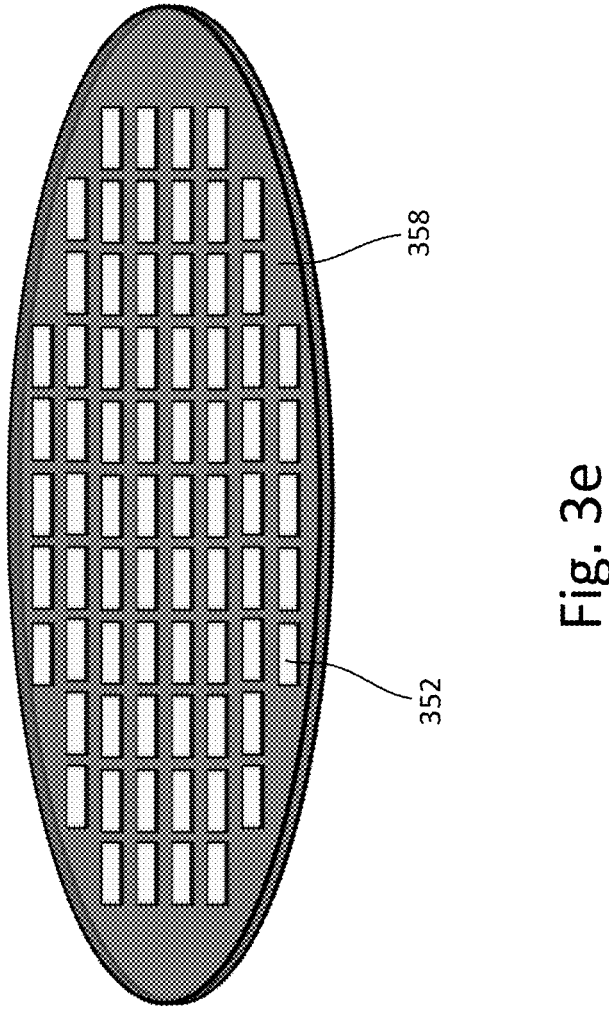
358
352
Fig. 3e
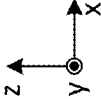

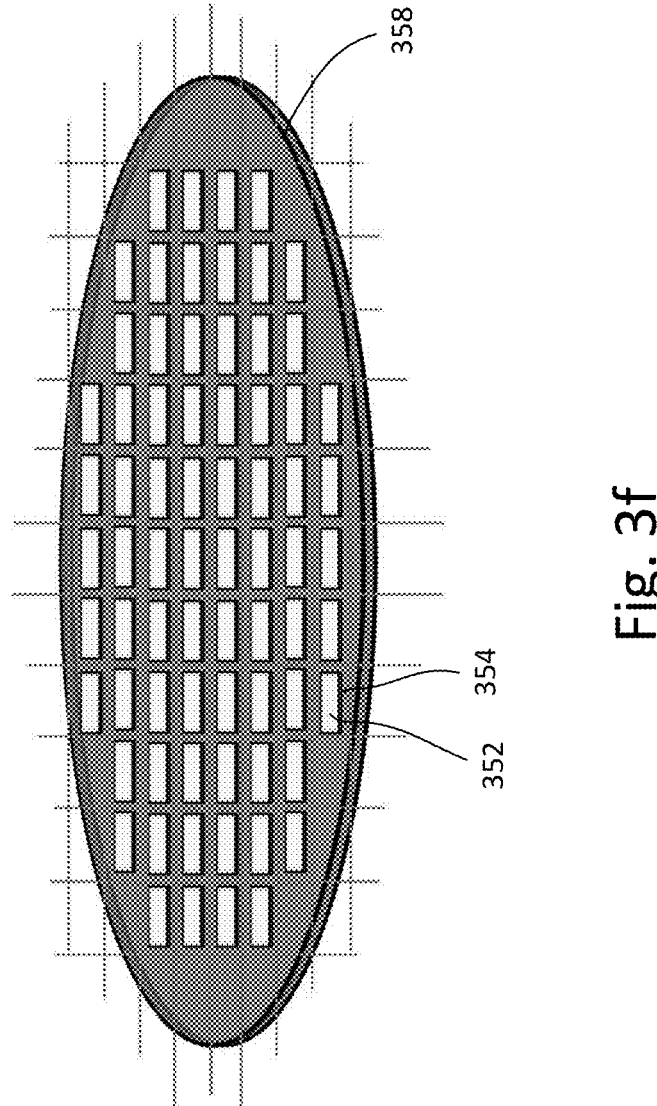
358
352    354
Fig. 3f

SEMICONDUCTOR PACKAGES WITH RELIABLE COVERS

CROSS-REFERENCE TO RELATED APPLICATION

This application claims the benefit of U.S. Provisional Application No. 63/250,228, filed on Sep. 30, 2021, which is incorporated herein by reference in its entity for all purposes.

FIELD OF THE INVENTION

The present disclosure relates to semiconductor packages and the manufacturing methods of such packages. In particular, the present disclosure relates to semiconductor packages for sensor chips with integrated cover structures. More specifically, the present disclosure relates to semiconductor packages for image sensor chips with integrated cover structures.

BACKGROUND

Semiconductor packages are employed for packaging semiconductor chips. For example, in the case of sensor packages, they are employed for packaging sensor chips. A sensor chip includes a sensor for sensing non-electrical signals from the surrounding environment. The sensor chip senses the non-electrical signals and converts them into electrical signals that are transmitted to a printed circuit board. For example, an image sensor chip converts incoming light or radiation waves into an electrical signal that can be viewed, analyzed, or stored. Image sensors may be used in electronic imaging devices of both analog and digital types, which include digital cameras, camera modules and medical imaging equipment. Most commonly used image sensors may include semiconductor charge-coupled devices (CCD) or active pixel sensors in complementary metal-oxide-semiconductor (CMOS) or N-type metal-oxide-semiconductor (NMOS, Live MOS) technologies.

Typically, a sensor package includes a transparent cover, such as glass, over the sensor area of the image sensor chip. The transparent cover permits light to reach the optically active area (sensor) of the sensor chip while creating a sealed cavity to protect the senor from the environment. An encapsulant is provided over the chip. The encapsulant encapsulates the chip but leaves the top of the transparent cover uncovered. For example, the encapsulant encapsulates a periphery and sides of the cover. The encapsulant exerts stress on the glass cover. However, conventional glass covers for sensor packages are susceptible to damage, compromising the integrity of the sealed cavity over the sensor area. This may negatively impact package reliability.

From the foregoing discussion, there is a desire to provide transparent covers that can withstand encapsulation stress, thereby improving reliability of semiconductor sensor packages.

SUMMARY

Embodiments generally relate to semiconductor packages and methods for manufacturing semiconductor packages.

In one embodiment, the semiconductor package includes a package substrate having top and bottom major package surfaces. The top major package surface includes a die region. A die is disposed on the die region. The die includes first and second major die surfaces. The second major die surface is attached to the die region of the top major package surface. The first major die surface includes a sensor region with a sensor and a cover adhesive region surrounding the sensor region. A cover structure is attached to the first major die surface. The cover structure includes first and second major cover structure surfaces and side surfaces. The cover structure includes a primary cover structure and a secondary cover structure. The secondary cover structure surrounds the primary cover structure. The secondary cover structure is configured to protect the primary cover structure from damage during packaging. A cover bond region is disposed on a bottom major cover structure surface. The bottom major cover structure surface faces the die. A cover adhesive is also included. The cover structure is configured to attach the cover structure to the die to form a sealed cavity between the cover structure and sensor region. The adhesive contacts the cover bond region on the bottom major cover structure surface and the cover adhesive on the first major die surface. The semiconductor package also includes an encapsulant which covers exposed portions of the package substrate, die and bond wires and side surfaces of the protective cover while leaving the first major cover surface exposed.

In another embodiment, a method for forming integrated cover structures for semiconductor package is disclosed. The method includes providing a cover support. The cover support includes a processing surface on which a plurality of cover structures are formed in parallel. The method also includes applying a double-sided adhesive tape on the processing surface. A plurality of primary cover structures are provided on the processing surface. The primary cover structures are configured for transmitting radiation to sensors of sensor chips of sensor semiconductor packages. The primary cover structure includes first and second primary planar surfaces and primary side surfaces. The method further includes attaching the plurality of primary cover structures on the processing surface. The adhesive tape facilitates maintaining positions of the primary cover structures on the processing surface. The method also includes molding the plurality of primary cover structures with mold compound to form a molded cover sheet; and singulating the molded cover sheet into a plurality of cover structures.

In yet another embodiment, a cover structure for a semiconductor package includes a primary cover structure and a secondary cover structure. The primary cover structure includes a top primary cover surface, a bottom primary cover surface and primary cover side surfaces. The top and bottom primary cover surfaces are parallel planar surfaces. The secondary cover structure includes a top secondary cover surface and a bottom secondary cover surface. The top and bottom secondary cover surfaces are parallel planar surfaces. The secondary cover structure also includes secondary inner cover side surfaces which contact the primary cover side surfaces, and secondary outer cover side surfaces which serve as the side cover structure surfaces. The secondary cover structure is configured to protect the primary cover structure from damage.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 1a-1b$_1$ show simplified top or bottom and cross-sectional views of an embodiment of a semiconductor package;

FIGS. 1b$_2$-1b$_4$ show simplified cross-sectional views of other embodiments of a semiconductor package;

FIGS. 2b$_1$-2b$_4$ show simplified cross-sectional views of various embodiments of a cover structure;

FIGS. 3a-3f show simplified cross-sectional views of an embodiment of a process for forming cover structures.

DETAILED DESCRIPTION

Embodiments described herein generally relate to semiconductor packages and methods for forming thereof In some embodiments, the semiconductor package includes a sensor chip used for sensing environmental signals, such as optical signals, audio signals, as well as other types of signals. The semiconductor package includes a cover or cover structure over the sensor chip. The cover structure protects the active sensor chip surface with the sensor(s), such as in an image sensor package. In particular, the cover structure includes an encapsulant surrounding a periphery of a transparent cover, such as glass. The encapsulant protects the transparent cover from encapsulation stress in the manufacturing process of the package. The semiconductor package may include other types of chips with a cover thereover. The semiconductor package may be incorporated into electronic devices or equipment, such as sensing devices, navigation devices, telecommunication devices, computers and smart devices.

Figure 1A:
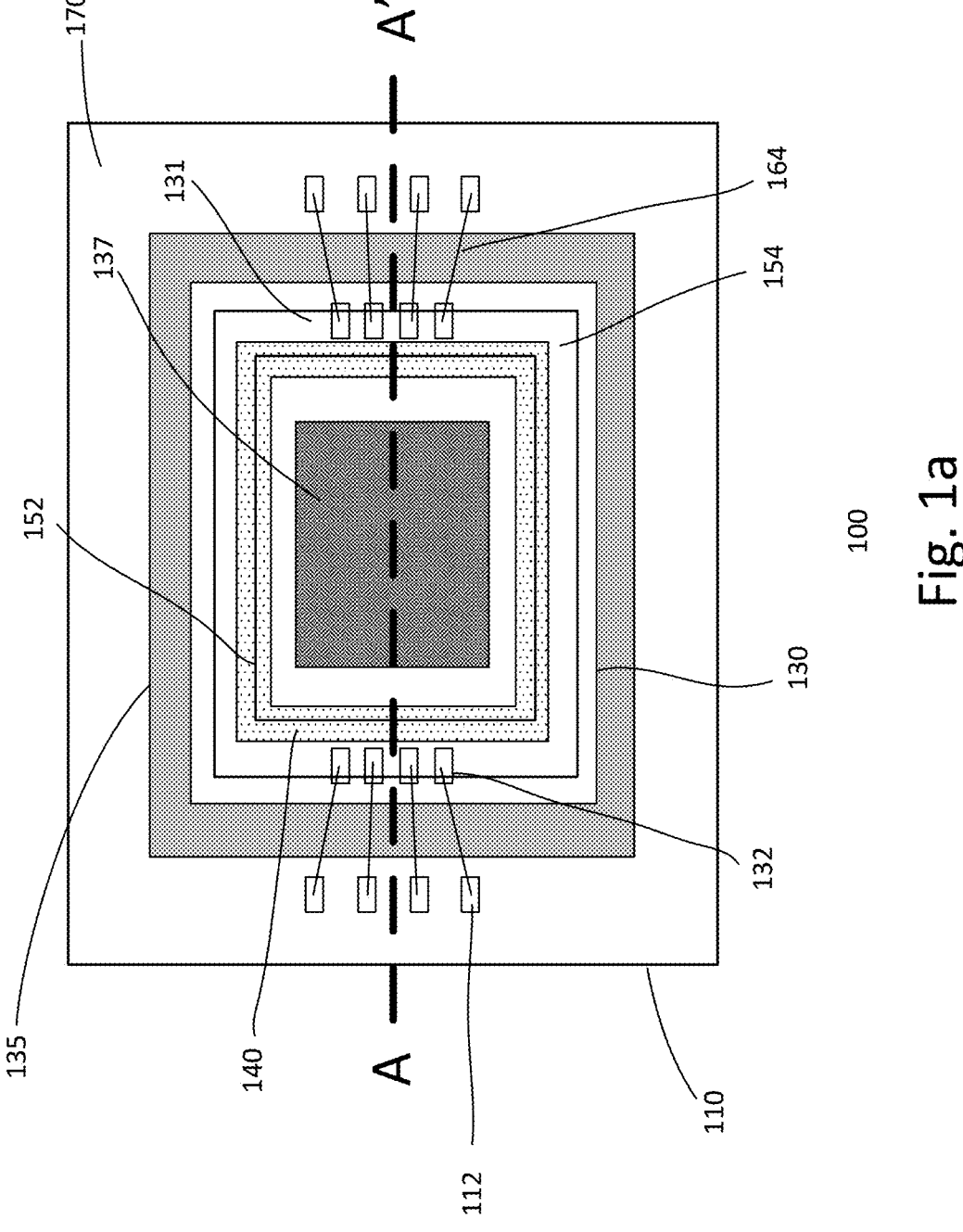

FIGS. 1a-1b$_1$ show simplified top or bottom and cross-sectional views along A-A' of an embodiment of a semiconductor package. A semiconductor package 100 is shown. The semiconductor package, for example, is a semiconductor sensor package. Other types of semiconductor packages may also be useful. The semiconductor package 100 includes a package substrate 110 having opposing first and second major surfaces 110a and 110b. The first major surface 110a may be referred to as the top substrate surface and the second major surface 110b may be referred to as the bottom substrate surface. The top substrate surface serves as a bonding surface for a die 130. Other designations for the surfaces may also be useful.

The package substrate may be a multi-layer substrate. For example, the package substrate includes a stack of electrically insulating substrate layers. The different layers of the package substrate 110 may be laminated or built-up. In one embodiment, the package substrate 110 is a laminate-based substrate including a core or intermediate layer sandwiched between top and bottom substrate layers. Other types of substrates, including ceramic and leadframe substrates, may also be useful. It is understood that the package substrate 110 may have various configurations, depending on design requirements.

The top surface of the package substrate may be defined with die and non-die regions 102 and 104. The non-die region 104, for example, surrounds the die region 102. For example, the die region may be centrally disposed within the top surface of the package substrate with the non-die region surrounding it. Providing a die region which is not centrally disposed within the top substrate surface may also be useful.

The top surface of the package substrate may include package bond pads 112. In some embodiments, the top surface of the package substrate includes package bond pads disposed outside a die attach region. The bottom substrate surface may include package pads 180 and package contacts 182. The package pads, for example, are electrically coupled to the package bond pads of the top surface of the package substrate. For example, each package pad is coupled to its respective package bond pad. The package substrate may include one or more conductive layers embedded therein. The conductive layers may form interconnect structures including conductive traces and contacts for interconnecting the package contacts to package bond pads.

A die or chip 130 is attached to the die region 102 of the top surface of the package substrate. The die, for example, includes first and second opposing major die surfaces 130a and 130b. The first major surface may be referred to as a top or active die surface and the second major surface may be referred to as a bottom or inactive die surface. In one embodiment, the die is a sensor chip. In one embodiment, the die is an image sensor chip. The image sensor chip, for example, detects radiation. Other types of dies, including non-sensor chips, may also be useful.

The die, as shown, is attached to the die region of the package substrate by a die adhesive 135. The adhesive may be a curable glue or adhesive tape. For example, a curing process may be performed to permanently attach the die to the die region. Other types of die adhesives may also be useful to attach the die to the die region. The bottom surface of the die, for example, is attached to the die region. For example, the inactive die surface is attached to the die region of the package substrate.

In one embodiment, the active die surface includes a sensor region 137. In the case of an image sensor chip, the sensor region may include a photosensitive sensor that may capture image information in response to light. The image sensor may be, for example, a CMOS or CCD type image sensor. Other types of sensors may also be useful. In one embodiment, the sensor region includes an array of sensors. For example, each sensor may correspond to a pixel of an image. The sensor chip may include CMOS components embedded in the chip for controlling the sensor chip. Other chip configurations may also be useful.

The active die surface may include die bond pads 132 disposed outside of the sensor region. For example, the die bond pads may be disposed on the non-sensor region of the active surface of the die. The die bond pads provide external electrical connections to various components of the chip. In one embodiment, bond wires 164 couple the package bond pads to the die bond pads. The bond wires enable external connections to the internal circuitry of the die.

A cover structure 150 is disposed over the die over the sensor region. The cover structure includes first or top and second or bottom opposing cover surfaces with sides or edges. The bottom cover surface, for example, faces the die. The cover structure is configured to enable light or radiation to penetrate through to the sensor region 137.

In one embodiment, the cover structure is an integrated cover structure. The integrated cover structure includes a primary cover structure 152 above the sensor region and a secondary cover structure 154 surrounding and integrated with the primary cover structure. The primary cover structure, in one embodiment, is configured to enable light or radiation to penetrate to the sensor region. For example, the primary cover structure may be a glass cover structure. In one embodiment, the primary cover structure is a rectangular-shaped cover structure. Other shaped primary cover structures may also be useful. The dimensions of the primary cover structure should be sufficient to enable radiation to penetrate through to the whole sensor. For example, the primary cover structure is larger than the sensor. The thickness of the primary cover structure may be about 0.5 mm. As for the thickness of the secondary cover structure, as shown, it may be the same as the primary cover structure. In other embodiments, the secondary cover structure may be thicker than the primary cover structure. For example, the thickness of the secondary cover structure may be about 0.6 mm. Other thicknesses for the primary and secondary cover structures may also be useful.

As for the secondary cover structure, it may be a ring-shaped structure which surrounds and contacts the primary cover structure. The secondary cover structure is configured to protect the primary cover structure from damage due to, for example, stress from the encapsulant during the packaging process. In one embodiment, the secondary cover structure includes an encapsulant cover structure. For example, the secondary cover structure is formed of an epoxy mold compound (EMC) cover, which withstands encapsulation stress during the packaging process. Other types of secondary cover structures which protects the primary cover structure from damage may also be useful.

The primary cover structure 152 includes first or top and second or bottom opposing primary cover surfaces 152a and 152b as well as side surfaces or walls 152c. The first and second primary cover surfaces are parallel planar surfaces. In the case of a rectangular-shaped primary cover structure, it includes 2 sets of opposing parallel primary cover side surfaces. For example, the primary cover structure includes first and second parallel opposing primary cover side surfaces and third and fourth parallel opposing primary cover side surfaces. Other configurations of the primary cover side surfaces may also be useful. For example, the configuration of the side surfaces may depend on the shape of the primary cover structure.

In one embodiment, the primary cover side surfaces are regular side surfaces. For example, a profile of the regular side surfaces is planar. The planar side surfaces, in one embodiment, are vertical planar side surfaces. Other vertical planar side surfaces may also be useful. For example, the side surfaces may be slanted side surfaces, either inwards or outwards with respect to one of the top or bottom surfaces. Providing the primary cover structure with irregular side surfaces may also be useful. Irregular side surfaces have a non-planar profile. Irregular side surfaces may include a stepped profile. The step profile may be, for example, a single-step or a multi-step profile. The step profile may be orthogonal or non-orthogonal. For example, the surfaces of the step profile may be orthogonal or non-orthogonal with respect to adjacent surfaces of the step profile. In the case of a multi-step profile, adjacent surfaces may further include a combination of orthogonal and non-orthogonal surfaces. Other primary cover side surface profiles may also be provided for the side surfaces of the primary cover structure. Furthermore, it is understood that not all surfaces need to have the same side surface profile. Preferably, opposing side surfaces have the same profile. Other configurations of side surface profiles may also be useful.

The secondary cover structure 154 includes first or top and second or bottom opposing secondary cover surfaces 154a and 154b as well as inner and outer side surfaces or walls 154i and 154o. The secondary cover structure is integrated with the primary cover structure via side walls. For example, the secondary cover inner side walls are bonded to the primary cover side walls. In general, the profile of secondary cover inner side walls is complementary to the profile of the primary cover side walls. In one embodiment, the profiles of the primary cover side walls and secondary cover side walls are complementary where they bond to each other. For example, the side wall bonding regions of the primary cover and secondary cover have complementary profiles to facilitate engagement.

As shown, the top and bottom secondary cover surfaces are coplanar with the top and bottom primary cover surfaces. Other configurations of the top and bottom primary cover surfaces and top and bottom secondary cover surfaces may also be useful. In some embodiments, the top primary cover surface may be recessed below the top secondary cover surface, the bottom secondary cover surface may be below the bottom primary cover surface or a combination of both. For example, either the top or bottom primary cover surfaces is recessed with respect to the top or bottom secondary cover surface or both the top and bottom primary cover surfaces are recessed with respect to the top and bottom secondary cover surfaces. In such cases, at least the bonding regions of the primary cover and secondary cover side walls have complementary profiles.

As for the secondary cover outer side surfaces, they include a regular side surface profile. As shown, the regular side surface profile is a vertical planar profile. Other regular side surface profiles, such as slanted planar profiles may also be useful. In some cases, the outer side surfaces may include an irregular side surface profile, similar to the inner surface profile. Other configurations of the outer side surface profile may also be useful. Furthermore, it is understood that not all outer side surfaces need to have the same profile. Preferably, opposing outer side surfaces have the same profile.

An adhesive 140 may be employed to attach the cover structure 150 over the die. The adhesive, for example, may be referred to as a cover adhesive for bonding the cover structure to the active surface of the die. In one embodiment, the top die surface includes an adhesive region 145 on which the adhesive 140 is disposed. The adhesive region, for example, surrounds the sensor region 137. In one embodiment, as shown, the adhesive region is disposed on a periphery portion of the die active surface with a gap exposed between the sensor region and inner sides of the adhesive region. For example, an adhesive ring 140 is disposed on the adhesive region surrounding the sensor region for attaching the cover structure 150 to the die. The adhesive may be a curable adhesive. For example, a curing process may be performed to permanently attach the cover to the die. The curing process, for example, may be performed to permanently attach the die to the die region of the package substrate and the cover structure to the die.

The cover structure sufficiently covers the sensor region. For example, the primary cover structure has a rectangular shape which is larger than the sensor region, ensuring that it sufficiently covers the sensor region. Providing a primary cover structure with other shapes may also be useful. The cover structure forms a vacuum cavity over the sensor region. For example, the cover structure hermetically seals the sensor region.

As discussed, the top die surface includes die bond pads 132. The die bond pads, for example, are disposed on a pad region 131 on the top or active die surface. As shown, the die bond pads are disposed outside the adhesive region 145. For example, the pad region with the die bond pads is disposed between the cover adhesive region and the edges of the die. The bond pads, for example, are disposed on opposing sides of the sensor region outside the adhesive region. Other configurations of die bond pads and wire bonds may also be useful. For example, the die bond pads may be disposed on the active die surface within the cover adhesive region, such as between the sensor region and the adhesive region. In addition, the die bond pads may be disposed on one side or more than 2 opposing sides of the sensor region.

In one embodiment, the bottom surface of the cover structure includes a bonding region 155. The bonding region, for example, may be referred to as a cover bonding region. The bonding region is aligned with the adhesive region 145 on the active surface of the die. For example, the bonding region is a continuous ring-shaped region aligned with the cover adhesive region to which the adhesive 140 is bonded on the cover structure. Other configurations or arrangements of the cover bonding region may also be useful.

An encapsulant 170 is disposed on the package substrate. The encapsulant 170 covers the package substrate, exposed portions of the die and wire bonds, and sides of the cover structure 150. The encapsulant leaves the top of the cover structure exposed. In one embodiment, a top of the encapsulant is coplanar with the top surface of the secondary cover structure. Providing the top of the encapsulant which is below the top surface of the secondary cover structure may also be useful. The encapsulant may be a mold compound, such as an epoxy mold compound (EMC). Other types of encapsulants may also be useful.

FIGS. 1$b_2$-1$b_4$ show simplified cross-sectional views of other embodiments of semiconductor packages. The top views of the semiconductor packages may be similar to that shown in FIG. 1$a$. The semiconductor packages are similar to that described in FIGS. 1$a$-1$b_1$. Common elements may not be described or described in detail.

As shown in FIG. 1$b_2$, the primary cover structure 152 includes regular primary side surfaces 152$c$ . For example, the primary regular side surfaces have a vertical planar profile. The secondary outer side surfaces have a regular secondary outer side surface profile. The regular secondary outer side surface profile is a vertical planar surface profile. Other configurations of the side surface profiles of the primary and secondary cover structures may also be useful. In one embodiment, the top primary cover surface 152$a$ is recessed (top primary cover structure surface recess) below the top secondary cover surface 154$a$.

The top primary cover structure recess, in one embodiment, may be facilitated by a protective tape on the top surface of the primary cover structure which is subsequently removed. For example, the depth of the recess is equal to the thickness of the protective tape. A typical depth of the recess may be about 50 um for a primary cover structure thickness of about 0.4-0.5 mm. Other depths may also be useful. The depth, for example, may depend on the thickness of the primary cover structure. The tape can be configured with a desired thickness corresponding to the depth of the recess. In some cases where the tape is not sufficiently thick enough, multiple protective tapes may be stacked to increase the thickness of the recess. The bottom surfaces of the primary and secondary cover structures are coplanar. Other configurations of the top and bottom surfaces of the primary and secondary cover structures may also be useful.

The encapsulant 170, as shown, has a top encapsulant surface 170$a$ which is recessed below the top secondary cover surface. Other configurations of the encapsulant and top secondary cover surfaces may also be useful.

Referring to FIG. 1$b_3$, the primary cover structure 150 includes irregular primary side surfaces 152$c$. For example, the irregular primary side surfaces have a step profile. As shown, the step profile is a single step profile with orthogonal adjacent surfaces. The secondary outer side surfaces have a regular secondary outer side surface profile. The regular side surface profile is a vertical planar surface profile. Other configurations of the side surface profiles of the primary and secondary cover structures may also be useful. The top surface 154$a$ of the secondary cover structure is wider than the bottom surface 154$b$ of the secondary cover. The top surfaces of the primary and secondary cover structures are coplanar. In one embodiment, the bottom primary cover surface 152$b$ is elevated above the bottom secondary cover surface 154$b$. For example, the bottom primary cover surface is recessed (bottom primary cover structure surface recess) with respect to the bottom secondary cover surface. Other configurations of the top and bottom surfaces of the primary and secondary cover structures may also be useful.

The bottom primary cover structure surface recess, in one embodiment, may be facilitated by a protective tape on the bottom surface of the primary cover structure which is subsequently removed. For example, the depth of the recess is equal to the thickness of the protective tape. A typical depth of the recess may be about 0.20-0.25 mm for a primary cover having a thickness of about 0.4-0.5 mm. Other depths may also be useful. The depth may, for example, depend on the thickness of the primary cover structure. The thickness of the tape can be configured to be the desired thickness. In some cases where the tape is not sufficiently thick enough, multiple protective tapes may be stacked to increase the thickness of the recess.

The encapsulant 170, as shown, has a top encapsulant surface which is coplanar with the top secondary cover surface. Other configurations of the encapsulant and top secondary cover surfaces may also be useful.

In FIG. 1$b$4, the primary cover structure 150 includes regular side surfaces 152$c$. For example, the primary regular side surfaces have a vertical planar profile. The secondary outer side surfaces have a regular secondary outer side surface profile. The regular secondary outer side surface profile is a vertical planar surface profile. Regarding the secondary inner side surface profile, it is a step profile. As shown the step profile is a multi-step profile with orthogonal adjacent surfaces. In one embodiment, upper and lower portions of the secondary cover structure covers the edge portions of the top and bottom primary surface 152$a$-$b$. For example, the top and bottom second surfaces 154$a$-$b$ extend over primary side surfaces and cover edge portions of the top and bottom primary surfaces. Other configurations of the side surface profiles of the primary and secondary cover structures may also be useful. In one embodiment, the top and bottom primary cover surfaces 152$a$-$b$ include top and bottom primary cover structure surface recesses. Other configurations of the top and bottom surfaces of the primary and secondary cover structures may also be useful.

The encapsulant 170, as shown, has a top encapsulant surface 170$a$ which is coplanar with the top secondary cover surface. Other configurations of the encapsulant and top secondary cover surfaces may also be useful.

FIG. 2$a$ illustrates a simplified top view of various embodiments of a cover structure and FIGS. 2$b_1$-2$b_4$ show simplified cross-sectional views of various embodiments of a cover structure. The semiconductor package is, for example, the same or similar to those described in FIGS. 1$a$ and 1$b_1$-1$b_4$. For example, the cover structure is for a semiconductor package with a sensor chip. Common elements and features may not be described or described in detail.

Figure 2A:
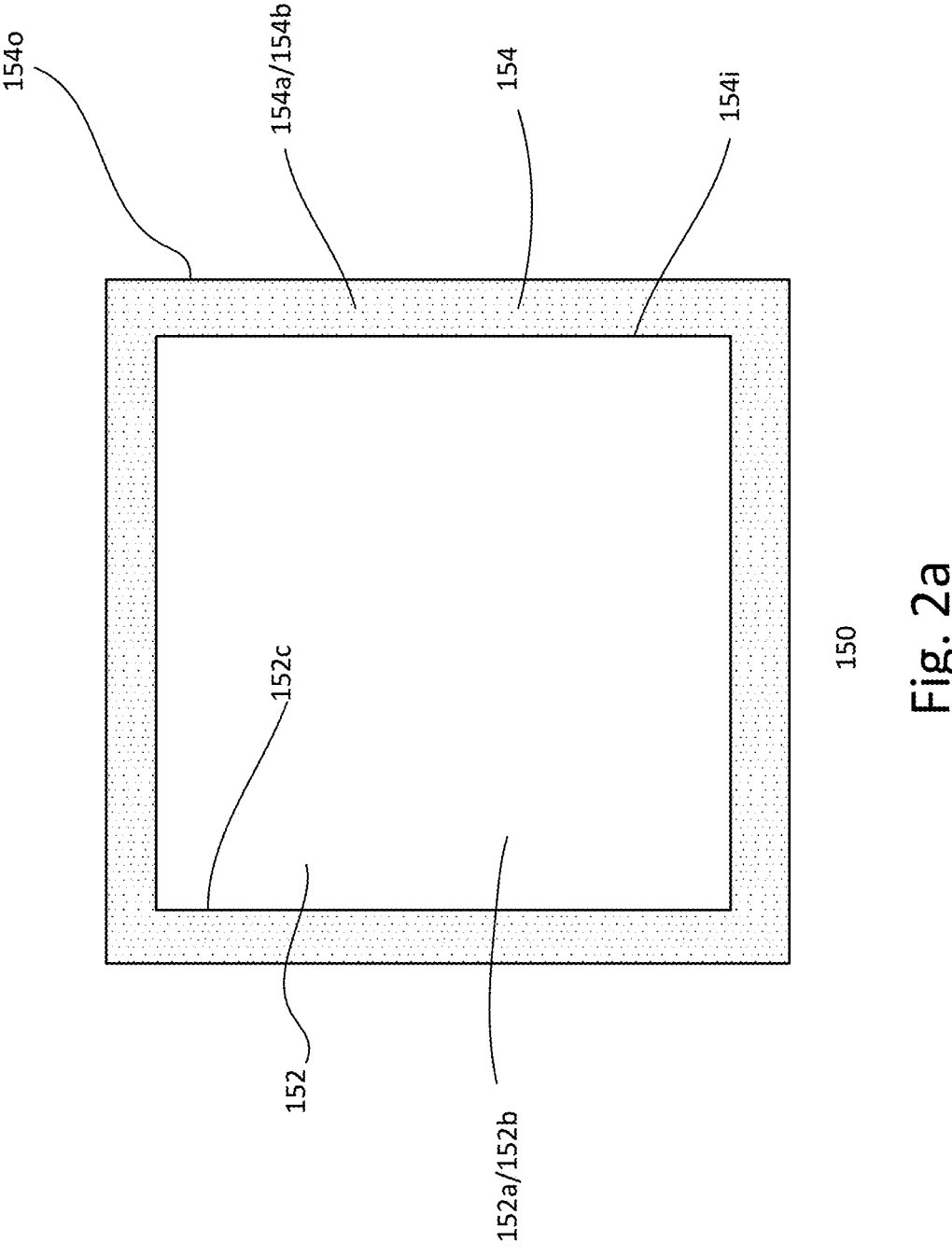
FIG. 2a shows a simplified top or bottom view of various embodiments of a cover structure for a semiconductor package.

Referring to FIG. 2a, a simplified top or bottom view of an integrated cover structure 150 is shown. The integrated cover structure includes a primary cover structure 152 and a secondary cover structure 154.

In one embodiment, the primary cover structure 152 may be configured to enable light or radiation to penetrate to the sensor region. For example, the primary cover structure may be a glass cover structure. Providing primary cover structures made of other materials may also be useful. As shown, the primary cover structure is a rectangular-shaped cover structure. Providing the primary cover structure with other shapes may also be useful. The primary cover structure, in one embodiment, includes a top primary cover surface 152a, a bottom primary cover surface 152b and primary cover side surfaces 152c. The dimensions of the primary cover structure should be sufficient to enable radiation to penetrate through to the whole sensor. For example, the primary cover structure is larger than the sensor. Of course, if the primary cover structure is too large, it would unnecessarily increase the size of the package. On the other hand, if the primary cover structure is too small, the radiation will be sensed by the complete sensor. A thickness of the primary cover structure may be about 0.4-0.5 mm. Other thicknesses may also be useful.

The primary cover side surfaces may be regular or irregular side surfaces. For example, the side surfaces can have a regular or irregular side surface profile. A regular side surface profile is a planar profile. For example, the side surface is a planar surface. The planar surface may be vertical or non-vertical, such as a slanted planar side surface. A slanted planar surface may slant inwardly or outwardly with respect to the top surface.

For an irregular side surface profile, it is a non-planar profile. The non-planar profile may be a step profile, such as a single or multi-step profile. The single step profile may be orthogonal or non-orthogonal. For the multi-step profile, it can be orthogonal, non-orthogonal or a combination thereof. Other non-planar profiles may also be useful. Preferably, all side surfaces are configured with the same side surface profile. Providing different side surfaces with different side surface profiles may also be useful. For example, opposing sets of side surfaces may be configured with the same side surface profile. Other configurations of side surfaces and side surface profiles may also be useful.

In one embodiment, the secondary cover structure is disposed on side surfaces of the primary cover structure. For example, the secondary cover structure is a ring structure surrounding the primary cover structure. The secondary cover structure is configured to protect the primary cover structure from damage due to, for example, stress from the encapsulant during the packaging process. In one embodiment, the secondary cover structure is formed from an encapsulant, such as EMC. The encapsulant secondary cover structure withstands encapsulation stress during the packaging process. Other types of secondary cover structures which protects the primary cover structure from damage may also be useful.

In one embodiment, the secondary cover structure includes top and bottom opposing secondary cover surfaces 154a and 154b, secondary cover inner side surfaces 154i and secondary cover outer side surfaces 154o. The secondary cover inner side surfaces are attached to the primary cover side surfaces.

In general, the profile of secondary cover inner side surfaces is complementary to the profile of the primary cover side surfaces. In one embodiment, the profiles of the primary cover side surfaces and secondary cover side surfaces are complementary where they bond to each other. For example, the side surface bonding regions of the primary cover side surfaces and secondary cover side surfaces have complementary profiles to facilitate engagement.

Top and bottom secondary cover surfaces may be coplanar with the top and bottom primary cover surfaces. Alternatively, either the top primary cover surface may be recessed with respect to the top secondary cover surface or the bottom primary cover surface may be recessed with respect to the bottom secondary cover surface. In some cases, both the top and bottom primary cover surfaces may be recessed with respect to the top and bottom secondary cover surfaces. Other configurations of the top and bottom primary cover surfaces and top and bottom secondary cover surfaces may also be useful. In the cases where at least one of the top or bottom primary cover surface is recessed, at least the bonding regions of the primary cover and secondary cover side surfaces have complementary profiles.

As for the secondary cover outer side surfaces, they include a regular side surface profile. As shown, the regular side surface profile is a vertical planar profile. Other regular side surface profiles, such as slanted planar profiles may also be useful. In some cases, the outer side surfaces may include an irregular side surface profile, similar to the inner surface profile. Other configurations of the outer side surface profile may also be useful. Furthermore, it is understood that not all outer side surfaces need to have the same profile. Preferably, opposing outer side surfaces have the same profile.

Referring to FIG. 2b₁, cross-sectional views of various exemplary cover structures $150_{1-4}$. As shown, the top and bottom primary cover surfaces 152a-b of the primary cover structure are coplanar with top and bottom secondary cover surfaces 154a-b of the secondary cover structure 154. The secondary outer side surfaces 154o are vertically planar side surfaces.

For cover structure $150_1$, the primary cover side surfaces and secondary primary cover surfaces have vertically planar side surfaces. For example, the side surfaces have regular side surface profiles which are orthogonal to the top and bottom surfaces. The cover structure $150_2$, as shown, have slanted planar side surfaces. The slanted planar side surfaces may have an angle of about ±30-60° or ±30-45° with respect to the vertical plane which is orthogonal to the horizontal plane of the top or bottom surfaces. Other slanted angles may also be useful. The top and bottom surfaces of the cover structure can be flipped. As for cover structures $150_{3-4}$, they have side surfaces with irregular side surface profiles. The cover structure $150_3$ includes side surfaces having a single step orthogonal profile. For example, adjacent surfaces of the step profile are orthogonal. As shown, the primary cover structure has a smaller top primary cover surface and a larger bottom primary cover surface. As for the cover structure $150_4$. The side surfaces have a single step non-orthogonal profile. For example, adjacent surfaces of the step profile are non-orthogonal. As shown, the bottom riser surface of the step profile is vertically planar, the step surface is slanted planar surface which slants upward and the top riser surface is vertically planar. For example, the slanted angle can be ±30-60° or ±30-45° with respect to the horizontal plane. Other slanted angles may also be useful. The top and bottom surfaces of the cover structure can be flipped. Other configurations of the surfaces of the step profile may also be useful.

The side surface profiles of the cover structures, in one embodiment, are created using saw blade cut. For regular side surface profiles, such as the vertical and slanted profiles, they can be created using single saw blade cut, for example, single blade vertical cut. For irregular side surface profiles, including the single step profiles, they can be created by multiple cuts. For example, a first cut using a thick saw blade is performed to partially cut and form the top riser surface of the step profile. A second cut employing a thin blade is subsequently performed to fully cut and form the bottom riser surface of the step profile. As for the slanted step surface, it can be created by a saw blade with slanted tip. Other techniques for forming the side surface profiles may also be useful.

The cover structures, as illustrated, include designated top and bottom surfaces. It is understood that the orientation of the cover structures can be flipped inside down. For example, the top surfaces will serve as the bottom surfaces and the bottom surfaces will serve as the top surfaces. In other words, the top and bottom of the cover structures can be interchanged.

FIG. $2b_2$ shows cross-sectional views of various exemplary cover structures $150_{5-8}$. As shown, the cover structures $150_{5-8}$ have similar side surface profiles as cover structures $150_{1-4}$. The secondary outer side surfaces 154$o$ are vertically planar side surfaces. As shown, top primary cover surface 152$a$ is recessed with respect to the top secondary cover surface 154$a$. To produce the recess, a protective tape may be provided on the top surface of the primary cover structure. After forming the secondary cover structure, the protective tape is removed, producing the recess. As shown, the recess has a vertical profile which is produced by a saw blade vertical cut. Other profiles may also be useful.

The cover structures include designated top and bottom surfaces. The orientation of the cover structures can be flipped upside down. For example, the top surfaces will serve as the bottom surfaces and the bottom surfaces will serve as the top surfaces. In other words, the top and bottom of the cover structures can be interchanged.

FIG. $2b_3$ shows cross-sectional views of various exemplary cover structures $150_{9-12}$. As shown, the cover structures $150_{9-12}$ have similar side surface profiles as cover structures $150_{1-4}$ of FIG. $2b_1$ and cover structures $150_{5-8}$ of FIG. $2b_2$. Furthermore, like cover structures $150_{5-8}$ of FIG. $2b_2$, the top primary cover surface 152$a$ is recessed below the top secondary cover surface 154$a$. The secondary outer side surfaces 154$o$ are vertically planar side surfaces. As shown, the upper portion of the secondary cover structure 154 includes an extension 155 which extends beyond the side surfaces 152$c$ of the top cover structure 150 and covers an edge portion of the top primary cover surface. In one embodiment, to form the extension, the protective tape covering the top of the primary cover surface may be processed to remove an edge portion prior to forming the secondary cover structure. For example, the protective tape is attached on a roller during transfer molding. The edge portion of the protective tape is automatically detached after molding. In the cases of other molding methods, such as compression molding, the edge portion of the protective tape is manually detached after molding. After forming the secondary cover structure, the protective tape is removed, leaving the extension. As shown, the extension has a vertical side wall profile. For example, the vertical profile is produced by a saw blade vertical cut. Other profiles may also be useful.

The cover structures include designated top and bottom surfaces. The orientation of the cover structures can be flipped upside down. For example, the top surfaces will serve as the bottom surfaces and the bottom surfaces will serve as the top surfaces. In other words, the top and bottom of the cover structures can be interchanged.

FIG. $2b_4$ shows cross-sectional views of various exemplary cover structures $150_{13-16}$. As shown, the cover structures $150_{13-16}$ have similar side surface profiles as cover structures $150_{1-4}$ of FIG. $2b_1$, cover structures $150_{5-8}$ of FIG. $2b_2$ and cover structures $150_{9-12}$ of FIG. $2b_3$. The secondary outer side surfaces 154$o$ are vertically planar side surfaces.

As shown, the cover structures include recessed top and bottom primary cover surfaces 152$a$-$b$ with respect to the top and bottom secondary cover surfaces 154$a$-$b$. The cover structure $150_{13}$ includes extensions 155$a$-$b$ which cover edge portions of the top and bottom top primary cover surface. The extension portion facilitates maintaining the secondary cover structure on the primary cover structure.

The cover structures include designated top and bottom surfaces. The orientation of the cover structures can be flipped upside down. For example, the top surfaces will serve as the bottom surfaces and the bottom surfaces will serve as the top surfaces. In other words, the top and bottom of the cover structures can be interchanged.

FIGS. 3$a$-3$f$ show simplified cross-sectional views of an embodiment of a process for forming a cover structure for a semiconductor package. The semiconductor package is, for example, the same or similar to those described in FIGS. 2$a$-2$b_3$. Common elements and features may not be described or described in detail.

Referring to FIG. 3$a$, the process includes providing a cover support 380. The cover support serves as a platform with a planar surface on which a plurality of cover structures are formed in parallel. In one embodiment, the cover support includes a wafer ring 380. The wafer ring may be a metal wafer ring, for example, a stainless steel wafer ring. The wafer ring is a circular-shaped planar support. Other types of cover supports may also be useful. For example, the cover support may be a strip tray. The strip tray may be a rectangular-shaped planar member. An adhesive tape 385 is laminated onto a processing surface of cover support the wafer ring. For example, the adhesive tape is laminated onto a processing surface of the wafer ring. In one embodiment, the adhesive tape is a double-sided adhesive tape. The adhesive tape may be a UV curable adhesive tape. Other types of adhesive tapes may also be useful.

In FIG. 3$b$, a plurality of pre-formed primary cover structures 352 are attached onto the adhesive tape 385. The primary cover structures may be the same or similar to those described in FIGS. 2$a$ and 2$b_1$-2$b_4$. The primary cover structures, for example, include glass cover structures. The glass cover structures may be singulated from a glass substrate. The glass substrate, for example, may be a glass wafer or a rectangular glass pane. The singulation process, for example, forms individual glass cover structures having the desired primary cover side surfaces.

The side surface profiles of the cover structures, in one embodiment, are created using saw blade cut. For regular side surface profiles, such as the vertical and slanted profiles, they can be created using single saw blade cut. For irregular side surface profiles, including the single step profiles, they can be created by multiple cuts. For example, a first cut using a thick saw blade is performed to partially cut and form the top riser surface of the step profile. A second cut employing a thin blade is subsequently performed to fully cut and form the bottom riser surface of the step profile. As for the slanted step surface, it can be created by a saw blade with slanted tip. Other techniques for forming the side surface profiles may also be useful.

In some embodiments, a protective tape is provided on at least one (top or bottom) of the major surfaces of the glass substrate. In other embodiments, both (top and bottom) major surfaces are provided with a protective tape. Alternatively, no protective tape is provided on any of the major surfaces of the glass substrate. The use of the protective tape enables cover structures with a recessed primary cover surface. In the case that the secondary cover structure includes extensions over the edge portion of the surface of the primary cover structure, the protective tape is patterned to form exposed portions of the primary cover structure when the extensions are formed. The protective tape patterned can be pre-cut based on chip size and shape.

As shown, the plurality of primary cover structures are arranged in a matrix format. For example, the cover support includes rows (e.g., x-direction) and columns (e.g., y-direction) of primary cover structures. This facilitates the singulation of the cover substrate into individual primary cover structures. When the primary cover structures include protective tape on only one (e.g., top or bottom) of the surfaces, the primary cover structures are attached to the cover support on the tape side or the non-tape side.

A molding process is performed, as shown in FIG. 3c. The molding process may be performed by transfer molding or compression molding using a mold compound. The molding process forms a molded cover sheet 358. Various types of mold compounds may be used. For example, the mold compound may be EMC. The mold compound may be a transparent, translucent or opaque compound. For example, the mold compound may be clear or black.

In one embodiment, the molding process includes overmolding. For example, the mold compound covers the tops of the primary cover structures. For example, the top surface of the molded cover sheet is the surface with the covered primary cover structures. As for the bottom surface of the molded cover sheet, it includes exposed primary cover structures. For example, the surface of the primary cover structures contacting the cover support is exposed.

Referring to FIG. 3d, the molded cover sheet 358 is processed. In one embodiment, the processing includes backgrinding the top surface of the molded cover sheet. In one embodiment, the backgrinding removes molded compound material until the primary cover structures are exposed. In the case that the surface of the primary cover structures includes protective tape, the protective tape is exposed.

In alternative embodiments, the molding process does not include overmolding. For example, the molding process produces a molded cover sheet in which the top surface of the molding and the top surface of the primary cover structures (or protective tape) are coplanar. In such cases, no backgrinding is needed.

In FIG. 3e, the molded cover sheet 358 is removed from the cover support. The molded cover sheet includes the top and bottom surfaces of the primary cover structure (or protective tape if applicable) exposed.

Referring to FIG. 3f, the molded cover sheet 358 is singulated into individual integrated cover structures having primary and secondary cover structures 352 and 354. The singulation process, for example, includes cutting the molded cover sheet in the x and y directions, thereby singulating the molded cover sheet into individual cover structures. For example, the molded cover sheet is singulated using Jigsaw singulation. Other techniques for singulating the molded cover sheet may also be useful.

Figure 4:
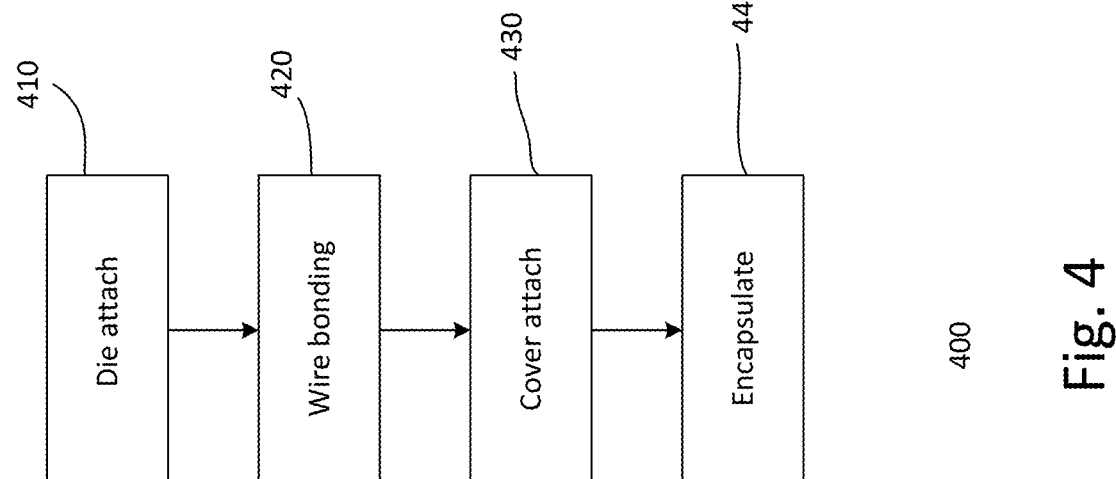
FIG. 4 shows a simplified embodiment process flow for forming a semiconductor package.

FIG. 4 shows a process flow 400 for an embodiment of forming a semiconductor package. The package, for example, is similar to those described in FIGS. 1a-1b₂. The package includes a cover structure or protective cover similar to those described in FIGS. 2a and 2b₁-b₄. Common elements may not be described or described in detail.

The process flow, for example, commences as 410. For example, the process flow, as shown, is at a stage where dies are formed on a wafer and singulated to form individual dies, and protective covers are formed using a cover substrate and singulated to form individual covers. The process includes providing a package substrate. The package substrate may include top and bottom major surfaces. The top surface of the package substrate may include a die region and package bond pads disposed outside of the die region. The bottom surface of the package substrate may include package contacts which are interconnected to the package bond pads on the opposing surface, for example, by one or more metal layers and via contacts embedded in the package substrate.

A die is attached to the die region. The die is attached, for example, by an adhesive. The adhesive may be an adhesive tape disposed on the die attach region. The die, for example, is temporarily attached to the die region. For example, a curing process may be performed to attach the die to the die region.

The process, in one embodiment, forms wire bonds at 420. The wire bonds connect the die pads on the top surface of the die to package bond pads on the top surface of the package substrate.

A protective cover is attached to the die at 430. The protective cover, for example, is an integrated cover structure with a primary cover structure surrounded by a secondary cover structure. Other types of protective cover may also be useful. To attach the protective cover to the die, an adhesive is employed. For example, the adhesive is applied onto the cover adhesive region on the die. The adhesive, for example, may be a UV-curable adhesive. Other types of adhesives may also be useful. The adhesive may be applied by dispensing. Other techniques for applying the adhesive may also be useful.

The protective cover is placed on the adhesive and the package is cured to permanently attach the cover to the die.

An encapsulant, such as EMC, is formed over the package substrate at 440. The encapsulant covers the package substrate, exposed portions of the die and wire bonds, and sides of the protective cover. A top surface of the encapsulant may be coplanar with a top surface of the secondary cover structure. Alternatively, the top surface of the encapsulant is located below the top surface of the secondary cover structure. The encapsulant may be formed by compression or transfer molding. Other techniques or materials may also be employed for the encapsulant.

Typically, the package substrate may be part of a package frame or strip with multiple package substrates. For example, the package substrates may be arranged in a matrix format, with rows and columns of package substrates. This facilitates parallel processing. For example, a plurality of dies are attached to the package substrates. After processing is completed, the package frame is singulated, separating it into individual packages.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A semiconductor package comprising:
a package substrate having top and bottom major package substrate surfaces, the top major package substrate surface includes a die region;
a die attached to the die region, the die includes
   a first major die surface, the first major die surface includes
      a sensor region with a sensor, and
      a cover adhesive region surrounding the sensor region;
   a second major die surface, the second major die surface is attached to the die region of the top major package substrate surface;
   a cover structure unit attached to the first major die surface, the cover structure unit includes top and bottom major cover structure unit surfaces and side cover structure unit surfaces, the cover structure unit comprises
      a primary cover structure, the primary cover structure includes top and bottom major primary cover structure surfaces and side primary cover structure surfaces,
      a secondary cover structure surrounding the primary cover structure and in direct contact with at least the side primary cover structure surfaces, the primary and secondary cover structures are an integrated unit to form the cover structure unit, the secondary cover structure is configured to protect the primary cover structure from damage during packaging to form the semiconductor package, wherein outer secondary cover structure side surfaces form the side cover structure unit surfaces,
      a top secondary cover structure surface and the top major primary cover structure surface form the top major cover structure unit surface, and
      a bottom secondary cover structure surface and the bottom major primary cover structure surface form the bottom major cover structure unit surface, and
      a cover bond region on the bottom major cover structure unit surface, the bottom major cover structure unit surface faces the die;
a cover adhesive contacts the cover adhesive region on the first major die surface and the cover bond region on the bottom major cover structure unit surface, the cover adhesive is configured to attach the cover structure unit to the die and to form a sealed cavity between the cover structure unit and the sensor region; and
an encapsulant, the encapsulant covers exposed portions of the package substrate, the die and bond wires and at least a portion of the side cover structure unit surfaces while leaving the top major cover structure unit surface exposed.

2. The semiconductor package of claim 1 wherein;
the primary cover structure comprises
   the top major primary cover structure surface, and
   the bottom major primary cover structure surface, wherein the top and bottom primary cover surfaces are parallel planar surfaces, and
   the side primary cover structure side surfaces;

the secondary cover structure comprises
   the top secondary cover structure surface, and
   the bottom secondary cover structure surface, wherein the top and bottom secondary cover structure surfaces are parallel planar surfaces,
   inner secondary cover structure side surfaces, wherein the inner secondary cover structure side surfaces directly contact the side primary cover structure surfaces, and
   wherein the outer secondary cover structure side surfaces serve as the side cover structure unit surfaces of the cover structure unit.

3. The semiconductor package of claim 2 wherein the side primary cover structure surfaces comprise regular side primary cover structure surfaces with a regular side surface profile, wherein the regular side surface profile comprises a planar surface.

4. The semiconductor package of claim 3 wherein the regular side surface profile comprises a vertical planar surface.

5. The semiconductor package of claim 2 wherein the primary cover structure is configured to enable light or radiation to penetrate to the sensor region.

6. The semiconductor package of claim 2 wherein the side primary cover structure surfaces comprise irregular side surfaces with an irregular side surface profile, wherein the irregular side surface profile comprises a non-planar surface.

7. The semiconductor package of claim 6 wherein the irregular side surface profile comprises a step profile.

8. The semiconductor package of claim 7 wherein the step profile comprises a single step profile, the single step profile comprises orthogonal adjacent surfaces or non-orthogonal adjacent side surfaces.

9. The semiconductor package of claim 7 wherein the step profile comprises a multi-step-profile, the multi-step profile comprises orthogonal adjacent surfaces, non-orthogonal adjacent surfaces or a combination thereof.

10. The semiconductor package of claim 2 wherein the top and bottom major primary cover structure surfaces are coplanar with the top and bottom secondary cover structure surfaces.

11. The semiconductor package of claim 2 wherein one of the top or bottom major primary cover structure surfaces is recessed (recessed primary cover structure surface) from the top or bottom secondary cover structure surfaces.

12. The semiconductor package of claim 11 wherein the secondary cover structure comprises a secondary cover structure extension extending over an edge portion of the recessed primary cover structure surfaces.

13. The semiconductor package of claim 2 wherein the top and bottom major primary cover structure surfaces (recessed primary cover structure surfaces) are recessed from the top and bottom secondary cover structure surfaces.

14. The semiconductor package of claim 13 wherein the secondary cover structure comprises at least one secondary cover structure extension extending over an edge portion of one of the recessed primary cover structure surfaces.

15. The semiconductor package of claim 1 wherein the secondary cover structure comprises a ring-shaped cover structure.

16. The semiconductor package of claim 1 wherein the primary cover structure comprises a rectangular-shaped cover structure.

17. The semiconductor package of claim 2 wherein the side primary cover structure surfaces comprise regular side surfaces, irregular side surfaces or a combination thereof.

18. A semiconductor package comprising:

a package substrate having top and bottom major package substrate surfaces, the top major package substrate surface includes a die region;

a die attached to the die region, the die includes a first major die surface, the first major die surface includes a sensor region with a sensor, and a cover adhesive region surrounding the sensor region;

a second major die surface, the second major die surface is attached to the die region of the top major package substrate surface;

a cover structure unit attached to the first major die surface, the cover structure unit comprises a primary cover structure, the primary cover structure includes top and bottom major primary cover structure surfaces and side primary cover structure surfaces, a secondary cover structure surrounding the primary cover structure and in direct contact with at least the side primary cover structure surfaces, the primary and secondary cover structures are an integrated unit to form the cover structure unit, the secondary cover structure is configured to protect the primary cover structure from damage during packaging to form the semiconductor package, and a cover bond region on the bottom major cover structure unit surface, the bottom major cover structure unit surface faces the die;

a cover adhesive, the cover adhesive is configured to attach the cover structure unit to the die to form a sealed cavity between the cover structure unit and the sensor region, wherein the cover adhesive contacts the cover bond region on the bottom major cover structure unit surface and the cover adhesive region on the first major die surface; and an encapsulant, the encapsulant covers exposed portions of the package substrate, die and bond wires and side surfaces of the cover structure while leaving the top major cover structure unit surface exposed.

19. The semiconductor package of claim 18 wherein the secondary cover structure comprises:

a top secondary cover structure surface;

a bottom secondary cover structure surface, wherein the top and bottom secondary cover structure surfaces are parallel planar surfaces;

inner secondary cover structure side surfaces, wherein the inner secondary cover structure side surfaces directly contact the side primary cover structure surfaces, and wherein outer secondary cover structure side surfaces serve as side cover structure unit surfaces of the cover structure unit.

20. The device of claim 18 wherein the secondary cover structure covers an edge portion of at least one of the top or bottom major primary cover structure surface.

\* \* \* \* \*